US006255668B1

(12) United States Patent
Kang et al.

(10) Patent No.: US 6,255,668 B1
(45) Date of Patent: Jul. 3, 2001

(54) THIN FILM TRANSISTOR WITH INCLINED ELETRODE SIDE SURFACES

(75) Inventors: Sung Gu Kang; Young Jun Jeon, both of Kyungsangbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/317,952

(22) Filed: May 25, 1999

(30) Foreign Application Priority Data

Jun. 5, 1998 (KR) ................................................ 98-20848

(51) Int. Cl.[7] .................................................. H01L 29/00
(52) U.S. Cl. ............................................. 257/59; 257/347
(58) Field of Search ............................... 257/59, 347–353

(56) References Cited

U.S. PATENT DOCUMENTS 5,198,694   3/1993   Kwasnick et al. .................... 257/766
5,362,660   11/1994  Kwasnick et al. ..................... 437/40

Primary Examiner—Fetsum Abraham

(74) Attorney, Agent, or Firm—Fleshner & Kim, LLP

(57) ABSTRACT

A thin film transistor is provided that includes a substrate, a gate electrode formed on the substrate, and a gate insulating layer formed all over the substrate including the gate electrode. A first semiconductor layer is formed on the gate insulating layer, and a second semiconductor layer is formed on the first semiconductor layer. Source and drain electrodes are separately etched together to expose a prescribed portion surface of the second semiconductor layer over the gate electrode. The source and drain electrodes adjacent to the prescribed portion of the second semiconductor layer are non-linearly inclined at their edges. A method of fabricating a thin film transistor includes forming a gate electrode on a substrate; forming a gate insulating layer on the gate electrode and the substrate, forming a first semiconductor layer on the gate insulating layer and forming a second semiconductor layer on the first semiconductor layer. First and second conductive materials are deposited on the second semiconductor layer. A single etching process is performed on the first and second conductive materials using the same etching gas to expose a prescribed part of the second semiconductor layer over the gate electrode to make the etched first and second conductive materials have a tier structure at edges of the prescribed part.

11 Claims, 12 Drawing Sheets

THIN FILM TRANSISTOR WITH INCLINED ELETRODE SIDE SURFACES

BACKGROUND OF THE INVENTION

1. Field of the Invention

The present invention relates to a semiconductor device, and in particular, to a thin film transistor and a method of fabricating the thin film transistor.

2. Background of the Related Art

Thin film transistors serve as switching devices switching image data signals in each pixel region. Thin film transistors can be used instead of CMOS load transistors or load resistors of a static random access memory (SRAM) of more than 1M bit. A liquid crystal display (LCD) includes an upper glass, a lower glass, and a liquid crystal interposed between the upper and lower glasses. The upper glass has a black matrix layer, a common electrode, and R, G and B color filter layers. The lower glass has data lines and gate line; crossing each other and pixel regions arranged in matrix. A pixel electrode is formed in each pixel region, and an amorphous thin film transistor acting like an analog switch is formed to control charge stored in its capacitor.

FIG. 1 is a lay-out of a related art liquid crystal display. As shown in FIG. 1, the lower glass includes a plurality of scanning lines 11 formed extending in one direction, a gate electrode 11a extending from each scanning line 11 and data lines 12 crossing the scanning lines 11. A thin film transistor includes a source electrode 12a and a drain electrode 12b extending from the data lines 12.

Black matrix layers (not shown) are arranged on the upper glass like a gauze to shut out the light in a region except the pixel electrodes (not shown) formed on the lower glass. R, G and B color filter layers (not shown) are formed between the black matrix layers. Further, a common electrode (not shown) is formed over the color filter layers and black matrix layers.

As shown in FIG. 2, a related art thin film transistor includes a gate electrode 11a formed on an insulating substrate 21, a gate insulating layer 22 disposed on gate electrode 11a and an amorphous silicon layer 23 disposed on gate insulating layer 22 to enclose the gate electrode 11a. An n+ silicon layer is formed as an ohmic layer 24 to expose a part of the amorphous silicon layer 23 on the gate electrode 11a, and the source electrode 12a and the drain electrode 12b are formed on the ohmic layer 24. The material of each of the source and drain electrodes 12a and 12b is molybdenum.

The process of manufacturing a related art thin film transistor will now be described. As shown in FIG. 3A, the gate electrode 11a is formed on a predetermined area of the insulating substrate 21. An insulating layer such as siliconitride SiN is formed on the substrate 21 including the gate electrode 11a to form the gate insulating layer 22. The insulating material used as the gate insulating layer 22 serves as a capacitor dielectric in a storage capacitor area. As shown in FIG. 3B, an amorphous silicon layer 32 and an n+ silicon layer 33 are formed on the gate insulating layer 22.

As shown in FIG. 3C, the n+ silicon layer 33 and the amorphous silicon layer 32 are selectively removed to enclose the gate electrode 11a. Molybdenum (Mo) is applied all over substrate 21 including the n+ silicon layer 33 as source and drain electrodes. The molybdenum material forming the source and drain electrodes and the n+ silicon layer 33 are serially etched to expose the amorphous silicon layer 32 corresponding to a channel region and form the source and drain electrodes 12a and 12b. Molybdenum (not shown), the material forming the source and drain electrodes, is patterned on the gate insulating layer 22 in the storage capacitor area of the pixel region to contact a pixel electrode in the post manufacturing process.

As shown in FIG. 3D, a passivation layer 34 is formed all over the substrate 21 including the source and drain electrodes 12a and 12b. Thus, the manufacture of the thin film transistor is complete.

In the manufacture of the thin film transistor, when fluorine (F) gas is used as an etching gas in an etching process to form source and drain electrodes, an etching selection ratio of n+ silicon layer 33 and amorphous silicon layer 32 cannot be secured. Thus, Chlorine (Cl) gas is used instead of the fluorine gas to solve the above problem. When using Cl gas, there is no etching selection ratio with gate insulating layer 22 of the storage capacitor area, which causes excessive etching of gate insulating layer 22, and, what is worse, gate insulating layer 22 may be opened.

A second related art thin film transistor was proposed to solve the above problem, and a method of fabricating the second related art thin film transistor will now be described. FIGS. 4A to 4J depict the steps in the manufacture of the second related art thin film transistor.

As shown in FIG. 4A, a gate material 44 formed of chromium 42 and molybdenum 43 is formed on a predetermined area of substrate 41. The gate material 44 can be constituted by either two layers (e.g., chromium 42 and molybdenum 43) or one layer.

Referring to FIG. 4B, the gate material 44 is patterned to form a gate electrode 44a by a general patterning process. Sides of the gate electrode 44a have a slant when formed by a reactive ion etching A) when patterning the two-layered gate electrode 44a formed by molybdenum 43 and chromium 42.

As shown in FIG. 4C, after patterning the gate electrode 44a, a gate insulating layer 45 is deposited all over the gate electrode 44a and the substrate 41. The gate electrode 44a is inclined at its edge to improve the coverage in the corresponding area. A gate electrode having a slant at its edge and a technique of improving the coverage are disclosed in U.S. Pat. No. 5,132,745.

As shown in FIG. 4D, an amorphous silicon layer 46 is serially deposited on the gate insulating layer 45 in a vacuum chamber. An n+ amorphous silicon layer 47 is serially deposited on the amorphous silicon layer 46. Subsequently, as shown in FIG. 4E, the n+ amorphous silicon layer 47 and the amorphous silicon layer 46 are selectively removed except in an area where a thin film transistor is formed on the substrate 41.

As shown in FIG. 4F, a first conductive layer 48 is deposited to a thickness of 0.01 to 0.1 $\mu$m on the gate insulating layer 45 including the patterned n+ amorphous silicon layer 47 and the amorphous silicon layer 46. The first conductive layer 48 is made of chromium (Cr) in ohmic contact with the n+ amorphous silicon layer 47. The first conductive layer 48 can be made of a material such as nichromium (nickel and chrormium) and tantalum.

A second conductive layer 49 is deposited to a thickness of 0.1 to 1 $\mu$m on the first conductive layer 48. Thus, the second conductive layer 49 is relatively larger than the first conductive layer 48. The second conductive layer 49 is made of molybdenum, and may be made of aluminum or tungsten. The use of molybdenum as second conductive layer 49 assures better conductivity than that of source and drain electrodes made of chromium (Cr), which constitutes the first conductive layer 48. Molybdenum assures a good ohmic contact for source and drain electrodes and the n+ amorphous silicon layer 47.

As shown in FIG. 4G, a photoresist 50 is applied on the second conductive material 49. The photoresist 50 corresponding to the channel region of the thin film transistor is removed, and the photoresist 50 is patterned to have edges slanted by 45°.

As shown in FIG. 4H, the second conductive material 49 is etched using the photoresist 50 as a mask with a requirement that the first conductive layer 48 is not effected. Based on the requirement of the etching process, $SF_6$ gas of 37.5 sccm, $Cl_2$ gas of 6.5 sccm, and $O_2$ gas of 16 sccm are used and a pressure of 6.5 mTorr is maintained. The etching process is carried out under Rf plasma. Since the photoresist 50 is patterned with inclined edges, the second conductive material 49 also becomes patterned with inclined edges.

As shown in FIG. 4I, the exposed first conductive layer 48, Cr, is selectively etched by changing the requirements for etching the second conductive layer 49. In other words, the first conductive layer 48 is etched in a different process than the second conductive layer 49. Etching the first conductive layer 48 forms a source electrode 51 and a drain electrode 51a, which are respectively made of the first conductive layer 48 and second conductive layer 49.

The first conductive layer 48 is etched away by the use of chroline gas, $Cl_2$ gas of 70 sccm and $O_2$ gas of 30 sccm as a source gas under the pressure of 100 mTorr. The first conductive material 48 and the photoresist are in the etching ratio of 1 to 1. Thus, the first conductive layer 48, Cr, is used as an etch stopper of the second conductive layer 49, and the etching speed of molybdenum, the second conductive layer 49 is higher than that of first conductive layer 48, Cr. When etching molybdenum and chromium as the source and drain electrodes 51 and 51a, molybdenum and chromium are inclined at their respective edges. As shown in FIG. 4J, the exposed n+ amorphous silicon layer 47 is etched to expose a part of the amorphous silicon layer 46. Further, after removing the photoresist, a the passivation layer 60 is formed all over the substrate 41 including the source electrode 51 and the drain electrode 51a, to complete the manufacture of the second related art thin film transistor.

The related art method of manufacturing the thin film transistor has various problems. When etching the source and drain electrodes made of molybdenum, the first conductive material, and chromium, the second conductive material, a two-step etching process is needed that increases the time to perform the etching process. Further, when etching molybdenum, the first conductive material, if the chromium, which is used as an etch stopper, is not uniformly deposited and has holes, the etching gas for etching the molybdenum etches the n+ amorphous silicon through the holes. Thus, an open in a signal line or driving degradation of thin film transistors can occur.

The above references are incorporated by reference herein where appropriate for appropriate teachings of additional or alternative details, features and/or technical background.

SUMMARY OF THE INVENTION

An object of the present invention is to provide a thin film transistor and method of fabricating a thin film transistor that substantially obviates one or more of the problems caused by limitations and disadvantages of the related art.

Another object of the present invention is to provide a thin film transistor and method of manufacturing the same that has source and drain electrodes formed by a single etching process.

Another object of the present invention is to provide a thin film transistor and method of manufacturing the same that has a less complex manufacturing process.

To achieve at least these objects and other advantages in a whole or in parts and in accordance with the purpose of the present invention, as embodied and broadly described, the present invention includes a thin film transistor that includes a thin film transistor including a substrate; a gate on the substrate; a gate insulating layer on the substrate and the gate electrode; a first semiconductor layer on the gate insulating layer; a second semiconductor layer on the first semiconductor layer; and first and second electrodes on the second semiconductor layer to expose the second semiconductor layer over the gate, wherein edges of the first and second electrodes adjacent to the exposed surface of the second semiconductor layer are non-linearly inclined.

To further achieve the above objects in a whole or in parts, a thin film transistor according to the present invention includes a thin film transistor including a substrate; a gate electrode on the substrate; a gate insulating layer on the substrate and the gate electrode; a first semiconductor layer on the gate insulating layer; a second semiconductor layer on the first semiconductor layer on the gate electrode; a first conductive material on the second semiconductor layer; and a second conductive material on the first conductive material, to expose edges of the first conductive material.

To further achieve the above objects in a whole or in parts, a method of fabricating a thin film transistor according to the present invention includes forming a trapezoidal shaped gate electrode on a substrate; forming a gate insulating layer on the substrate and the gate electrode; forming a first semiconductor layer on the gate insulating layer; forming a second semiconductor layer on the first semiconductor layer; depositing a first conductive material and a second conductive material on the second semiconductor layer; and selectively removing the first conductive material and the second conductive material using a single etching gas to expose a prescribed part of the second semiconductor layer over the gate electrode, wherein respective edges of the etched first and second conductive materials are non-linearly inclined.

Additional advantages, objects, and features of the invention will be set forth in part in the description which follows and in part will become apparent to those have ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
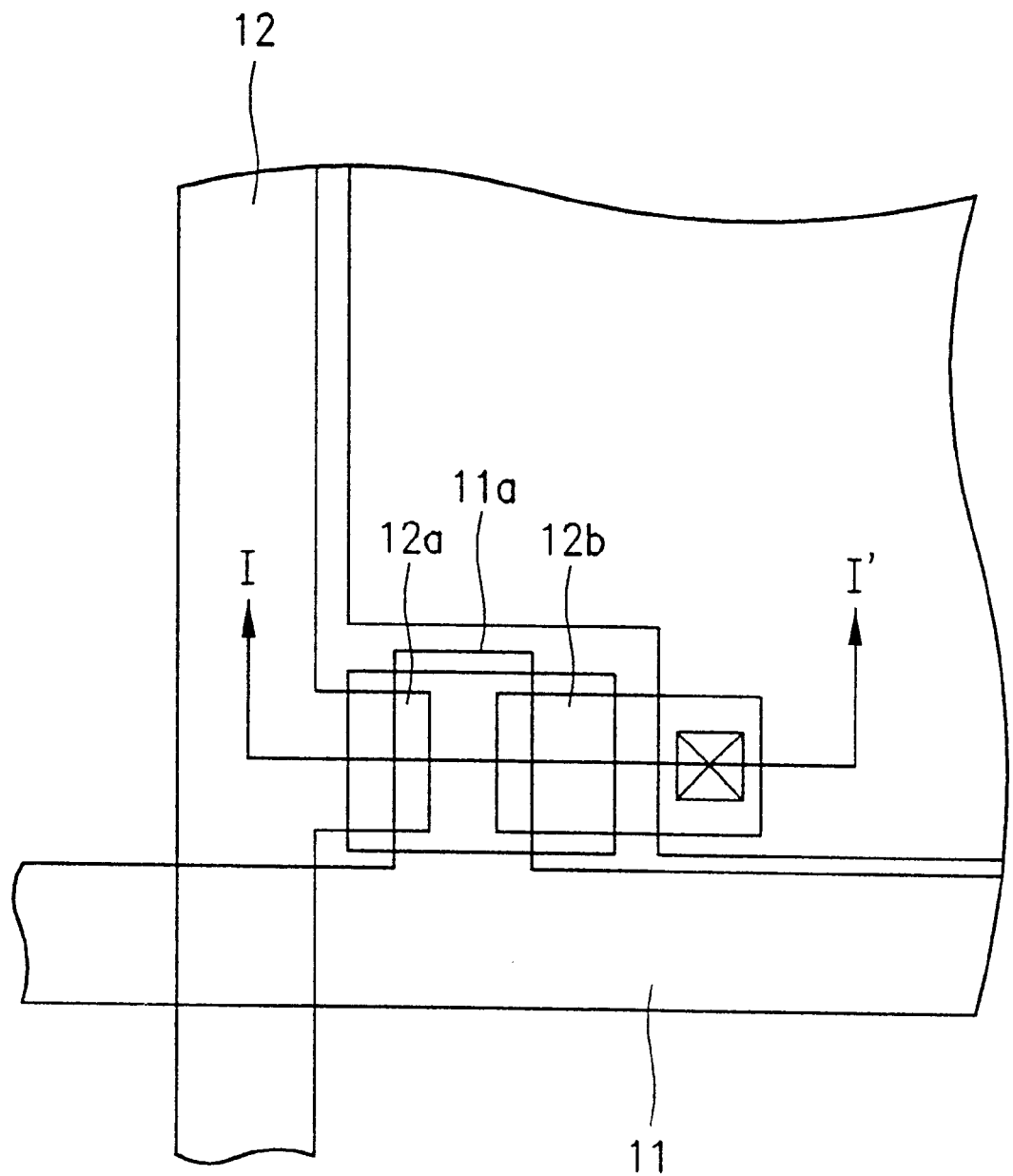
FIG. 1 is a diagram showing a related art liquid crystal display.
Figure 2:
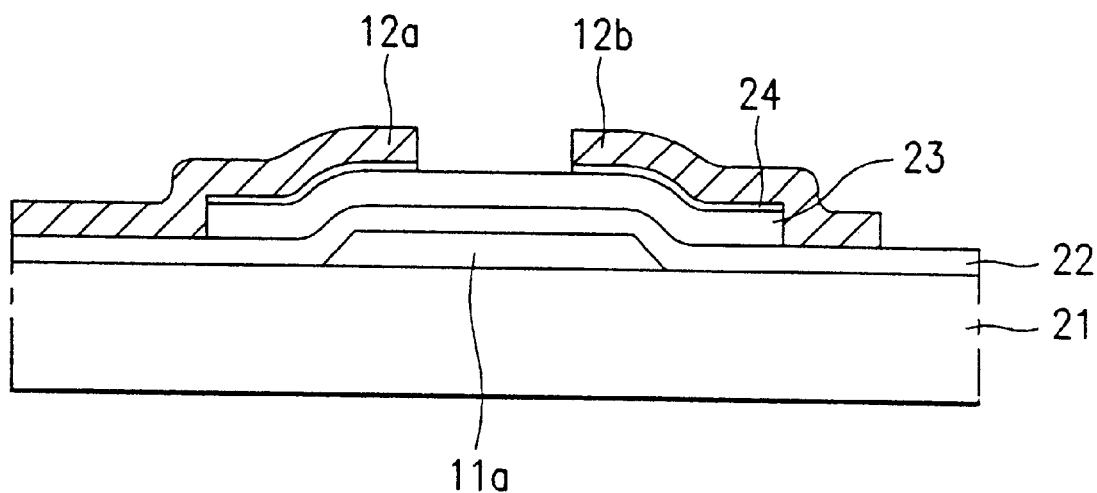
FIG. 2 is a diagram showing a sectional view along line I–I' of FIG. 1.
Figure 3A:
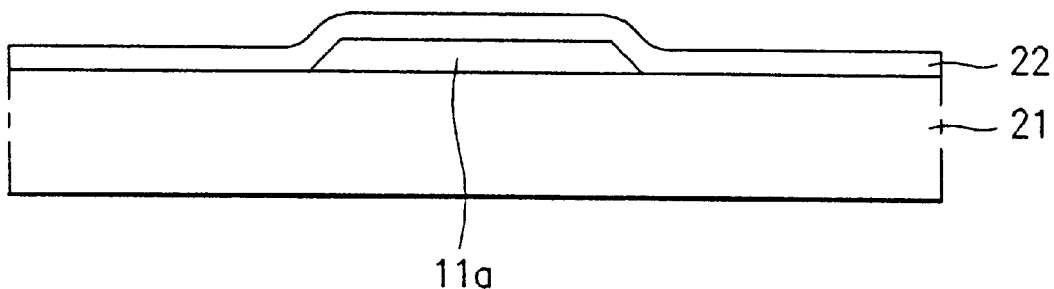
FIGS. 3A to 3D are diagrams showing sectional views of a related art thin film transistor.
Figure 3B:
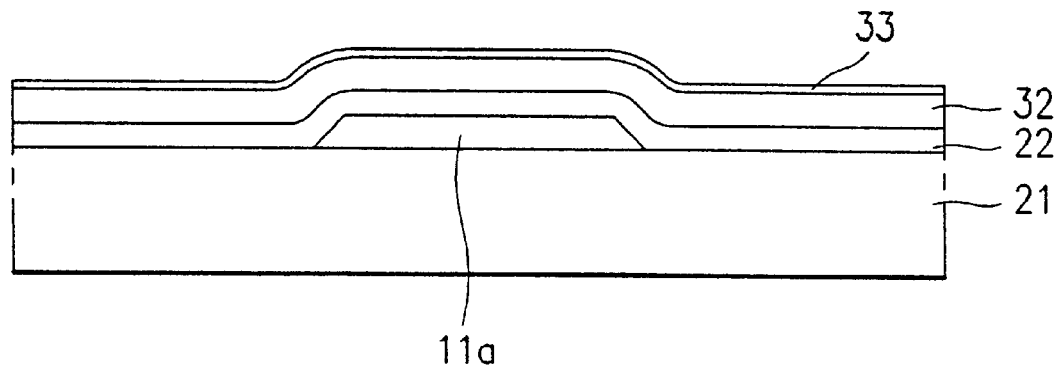
Figure 3C:
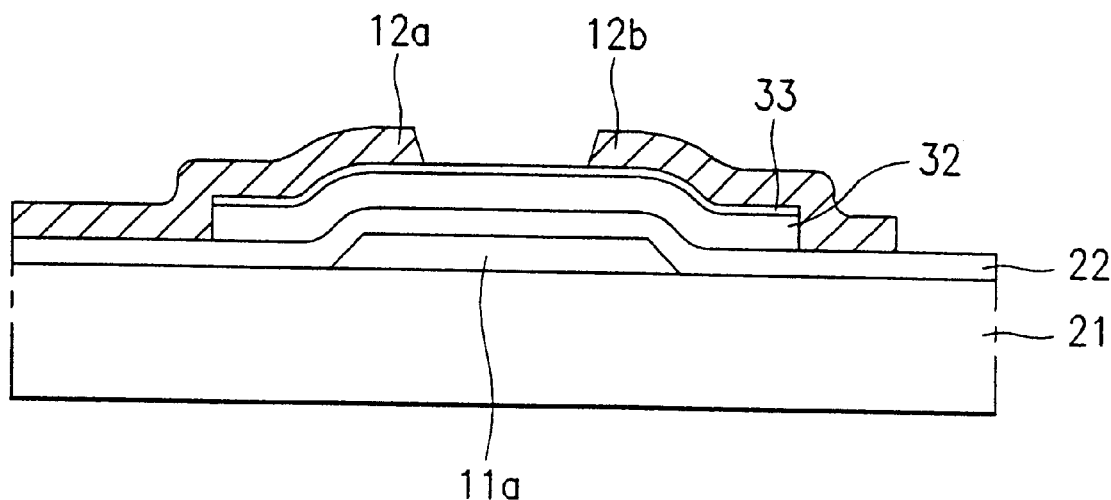
Figure 3D:
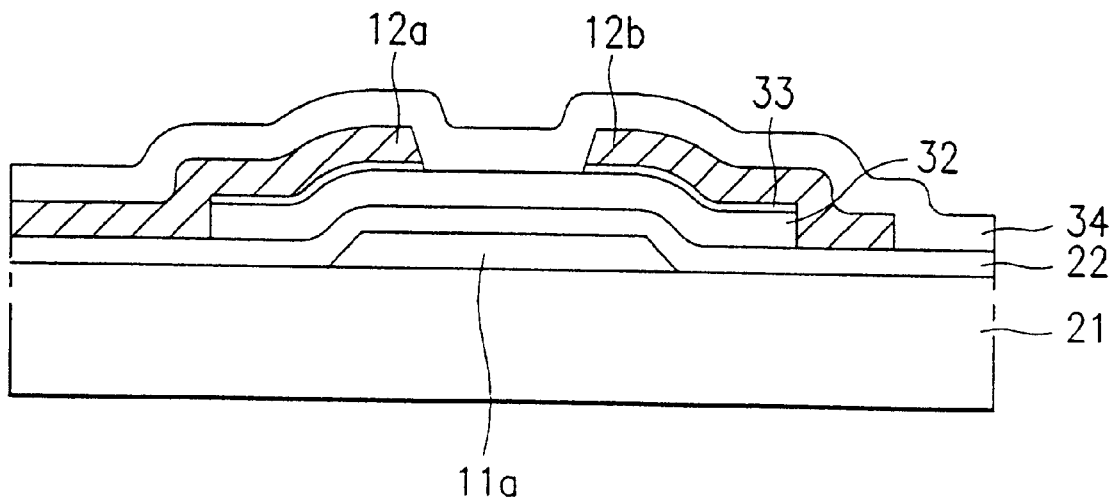
Figure 4A:
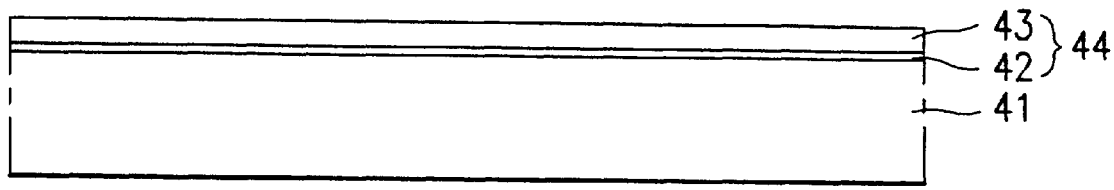
FIGS. 4A to 4J are diagrams showing sectional views of steps in the manufacture of a related art thin film transistor.
Figure 4B:
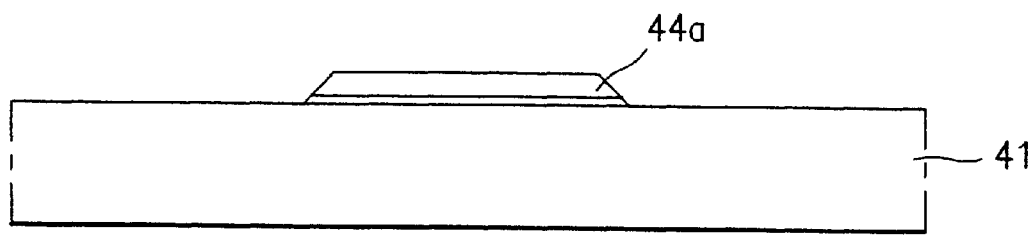
Figure 4C:
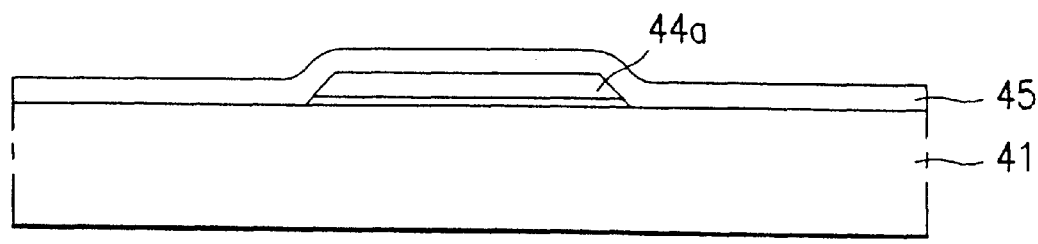
Figure 4D:
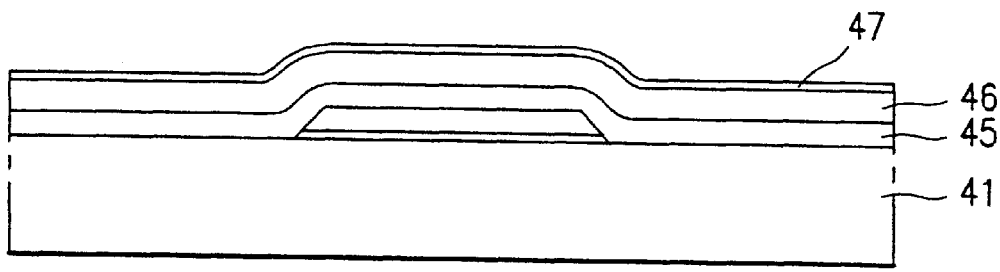
Figure 4E:
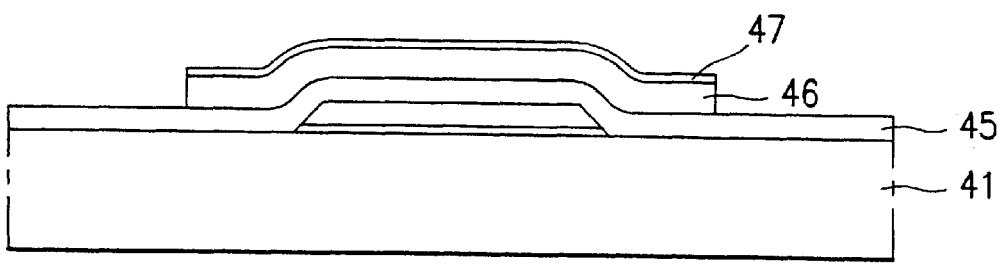
Figure 4F:
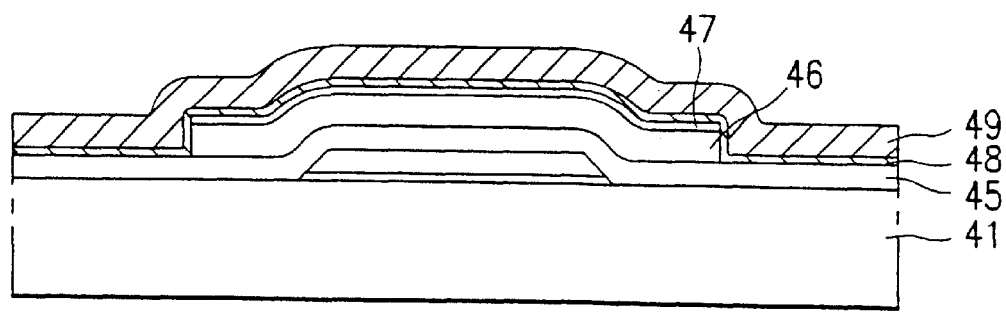
Figure 4G:
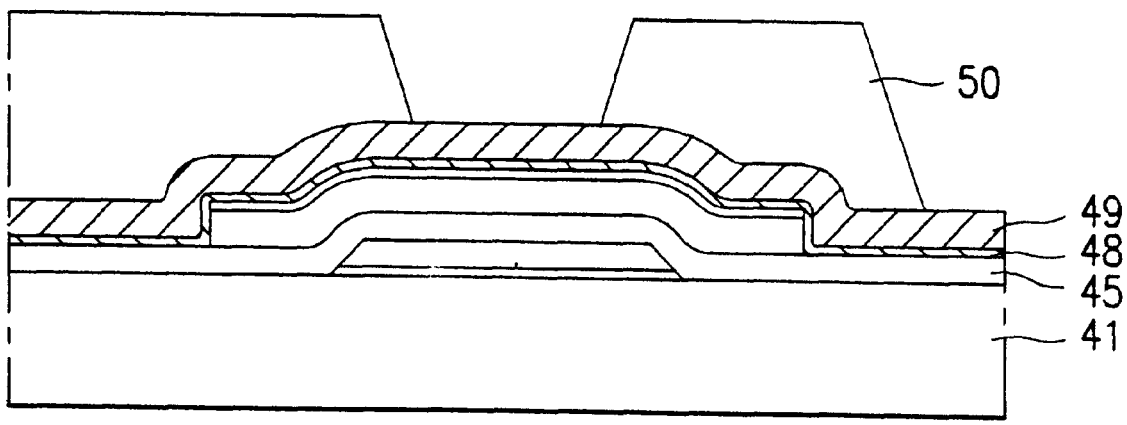
Figure 4H:
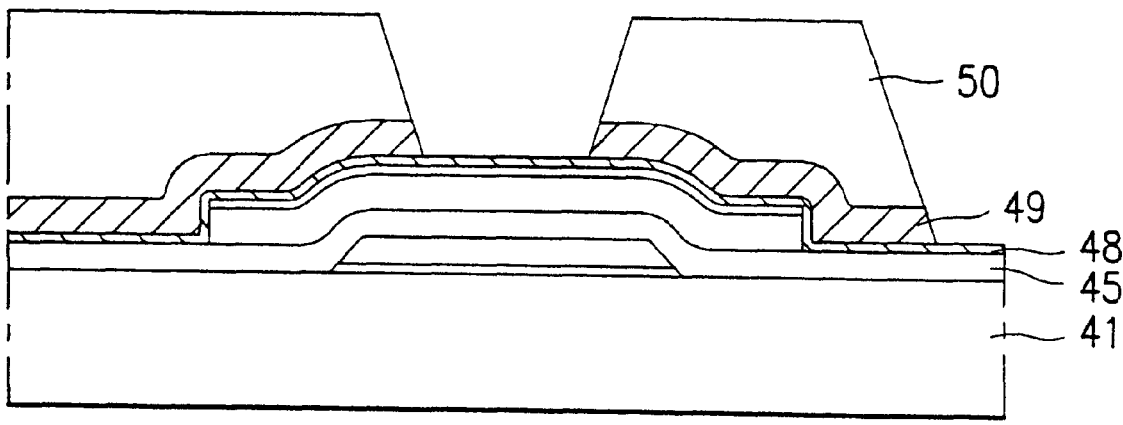
Figure 4I:
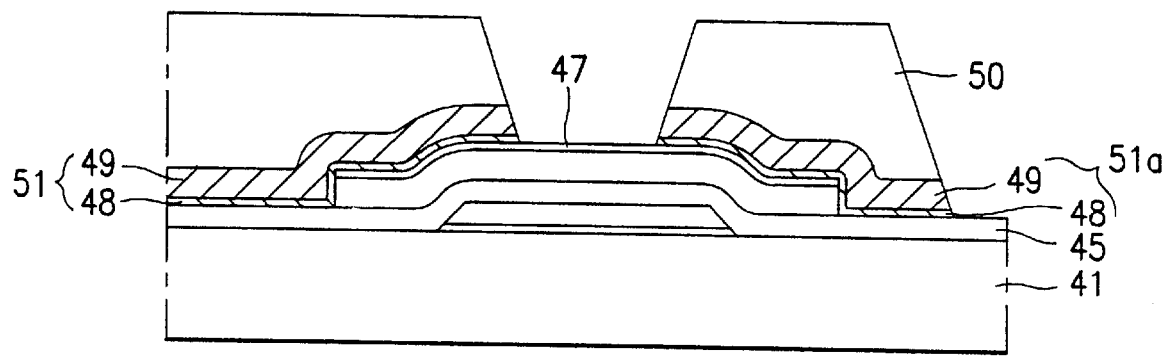
Figure 4J:
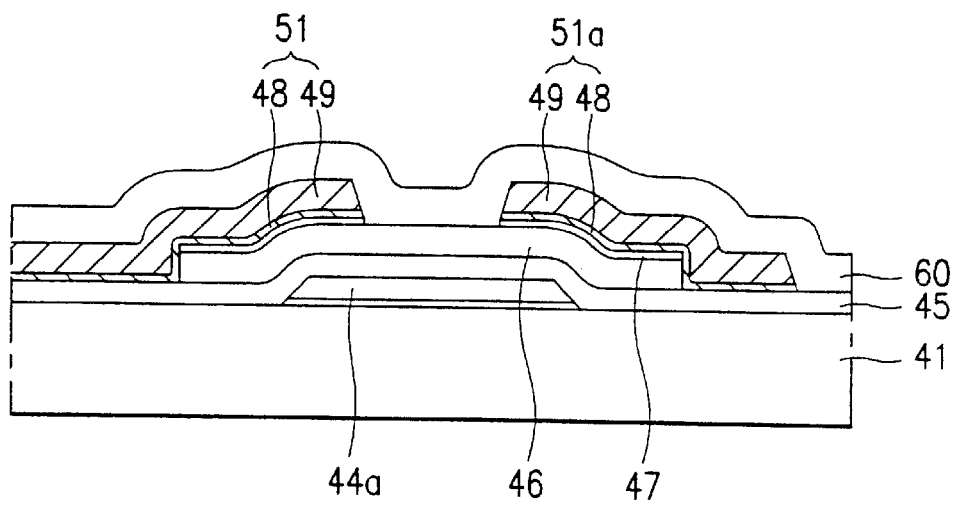
Figure 5:
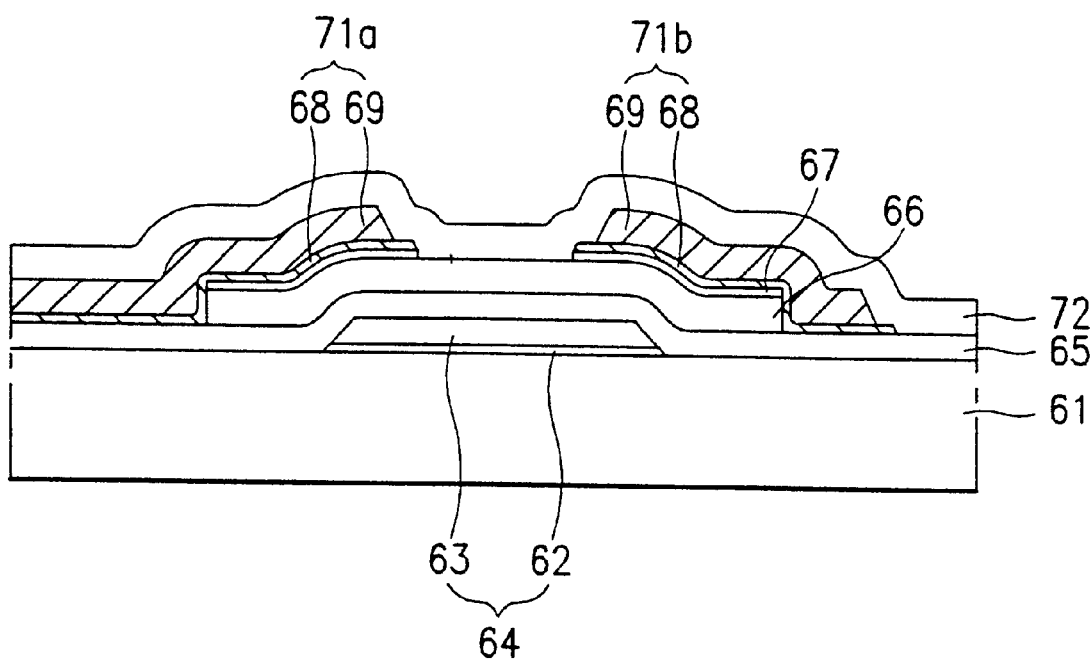
FIG. 5 is a diagram showing a sectional view of a preferred embodiment of a thin film transistor in accordance with the present invention.

FIG. 5 is a diagram showing a cross-section of a preferred embodiment of a thin film transistor in accordance with the present invention. As shown in FIG. 5, the preferred embodiment of the thin film transistor includes a substrate 61, a gate electrode 64 formed on the substrate 61, a gate insulating layer 65 formed all over substrate 61 including the gate electrode 64 and an amorphous silicon layer 66 formed on the gate insulating layer 65. The gate electrode 64 preferably has a trapezoidal cross-section. An n+ amorphous silicon layer 67 is separately formed on the amorphous silicon layer 66 to expose the amorphous silicon layer 66, which is used as a channel region. Source and drain electrodes 71 and 71b are formed on the n+ amorphous silicon layer 67 and preferably have a non-linear slant or step at their edges. A passivation layer 72 is formed on the substrate 61 including the source and drain electrodes 71a and 71b. The source and drain electrodes 71a and 71b are preferably made of two-layered conductive material.

A first conductive material is preferably chromium (Cr) and a second conductive material is preferably molybdenum. As shown in FIG. 5, an edge of the first conductive material (Cr) adjacent to the channel region does not correspond to an edge of the second conductive material (Mo).

A preferred embodiment of a method for manufacturing a thin film transistor (TFT) in accordance with the present invention will now be described. The preferred embodiment of the method for manufacturing the TFT can be used, for example, to produce the preferred embodiment of a TFT shown in FIG. 5.

Figure 6A:
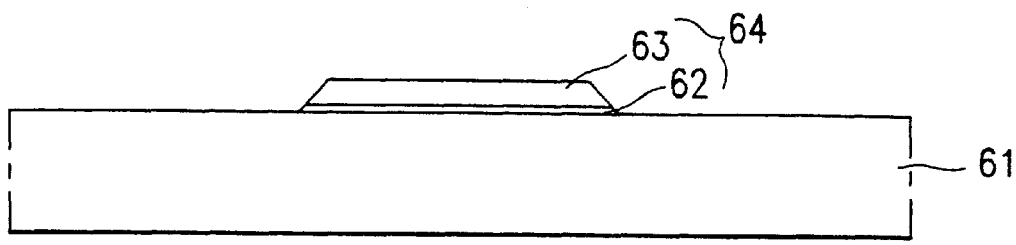
FIGS. 6A to 6H are diagrams showing cross-sectional views of a preferred embodiment of a method to manufacture a thin film transistor in accordance with the present invention.

As shown in FIG. 6A, a chromium (Cr) layer 62 is formed on an insulating substrate 61 as a gate electrode material, and a molybdenum layer 63 is formed on the chromium layer 62. The gate electrode material is selectively removed by an etching technique to form the gate electrode 64. Thus, the gate electrode 64 is preferably made of chromium and molybdenum. However, the gate electrode 64 can be made, for example, of molybdenum only. Further, the gate electrode preferably has a trapezoidal crosssection.

Figure 6B:
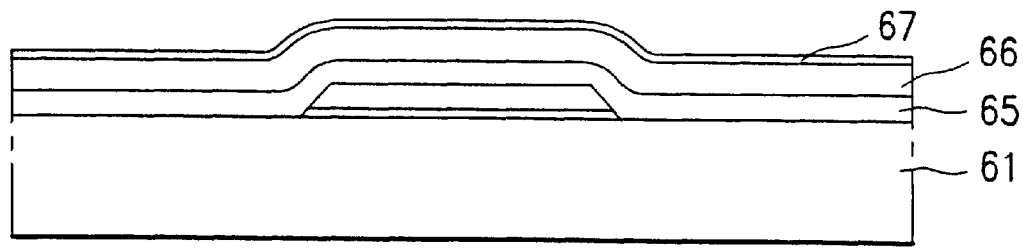

As shown in FIG. 6B, a gate insulating layer 65 is formed all over the substrate 61 including the gate electrode 64. An amorphous silicon layer 66 is deposited on the gate insulating layer 65 in a vacuum chamber used for the deposition of gate insulating layer 65. An n+ amorphous silicon layer 67 is serially deposited on the amorphous silicon layer 66.

Figure 6C:
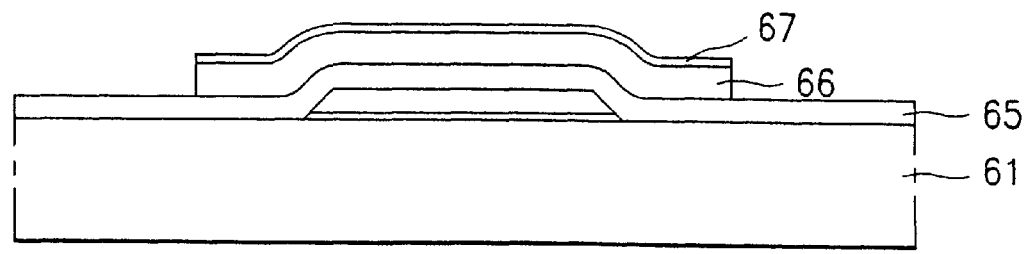

As shown in FIG. 6C, the n+ amorphous silicon layer 67 and the amorphous silicon layer 66 on the substrate 61 are selectively removed except for a thin film transistor area.

Figure 6D:
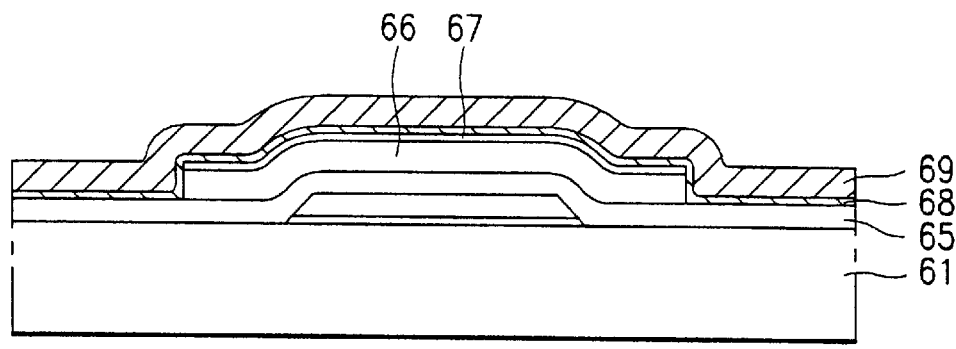

As shown in FIG. 6D, a first conductive material 68 is deposited on the gate insulating layer 65 including the patterned n+ amorphous silicon layer 67, and the amorphous silicon layer 66 to be used as a source and a drain electrode material. Chromium is preferably used for the first conductive material 68. However, the first conductive material 68 may be nichromium (alloy of nickel and chromium) or tantalum having a good ohmic contact with the n+ amorphous silicon layer 67.

Figure 6E:
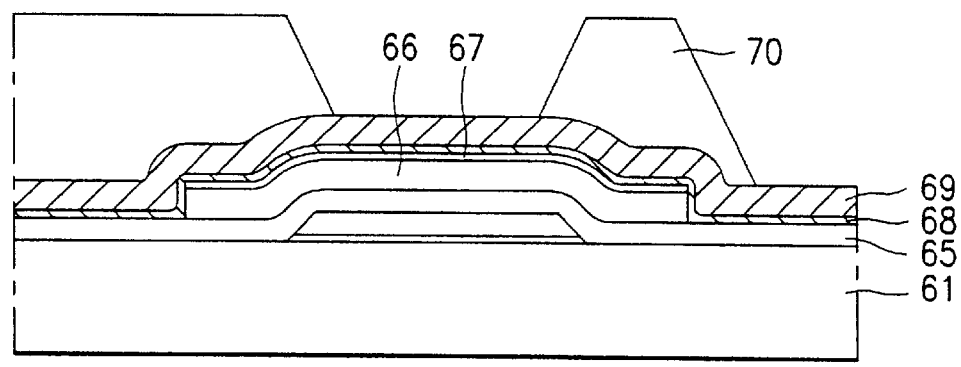

A second conductive material 69 is deposited on the first conductive material 68 to be relatively thicker than the first conductive material 68. The second conductive material 69 is preferably molybdenum, but can be aluminum or tungsten. As shown in FIG. 6E, photoresist 70 is applied to the second conductive material 69. The photoresist 70 is removed on the channel region of the thin film transistor by photolithography.

Figure 6F:
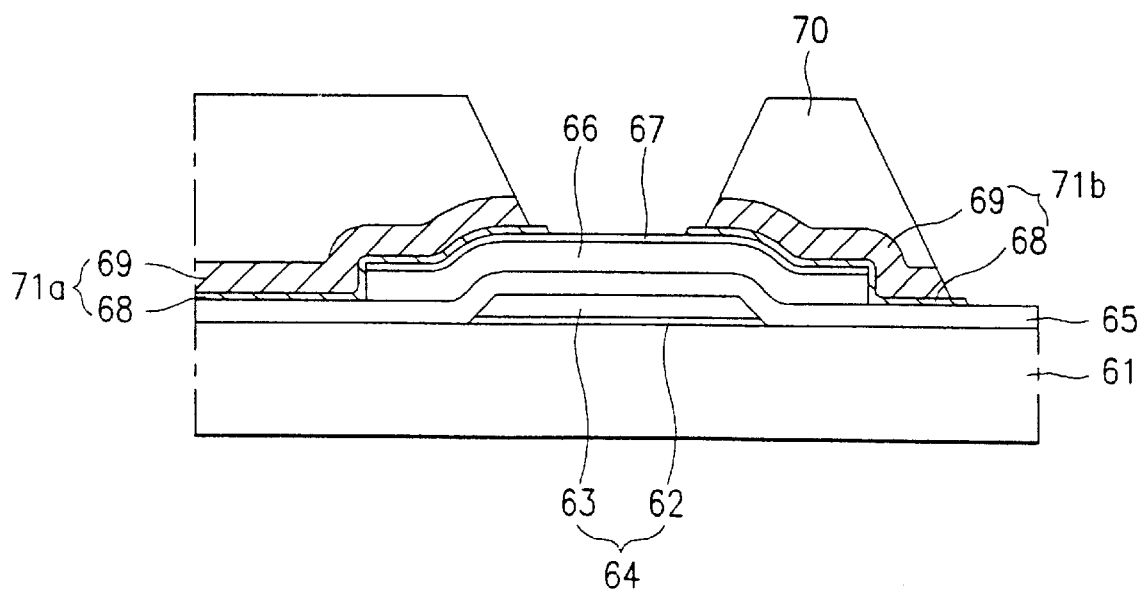

As shown in FIG. 6F, the second conductive material 69 and the first conductive material 68 are serially etched by the same etching gas in a single process using the patterned photoresist 70 as a mask.

$Cl_2$ gas+$O_2$ gas are preferably used as the etching gas, and the amount of $Cl_2$ gas is approximately in the range of 400 to 600 sccm and more preferably, 500 sccm. The amount of $O_2$ gas is approximately in the range of 300 to 500 sccm, and more preferably, 400 sccm. The pressure during etching is approximately in the range of 100 to 200 mTorr, and RF power is approximately 0.5 to 0.8 watts/$cm^2$, and more preferably, 0.66 watts/$cm^2$. Reactive ion etching or plasma etching can be used. The first conductive material 68 and the second conductive material 69 are serially etched in the same chamber without changing the etching condition to pattern the source and drain electrodes 71a and 71b.

When using the $Cl_2$ gas+$O_2$ gas mixture according to the present invention for etching, chromium, the first conductive material 68 and molybdenum, the second conductive material 69, have different etching ratios. Accordingly, edges of the source and drain electrodes are in steps or tiers. Chromium and molybdenum reacting to the $Cl_2$+$O_2$ etching gas, have an etching ratio of 10 to 1. Further, chromium, the first conductive material 68, and the n+ amorphous silicon layer 67 have an etching ratio of 4 to 1.

Since molybdenum and the n+ amorphous silicon layer 67 are in the etching ratio of 40 to 1, the n+ amorphous silicon layer 67 is not over-etched even if holes area formed by particles when depositing the first conductive material 68. In addition, the etching selection ratio of the gate insulating layer 65 in the pixel area adjacent to the edge of drain electrode 71b can be secured to prevent the gate insulating layer 65 from being over-etched.

Figure 6G:
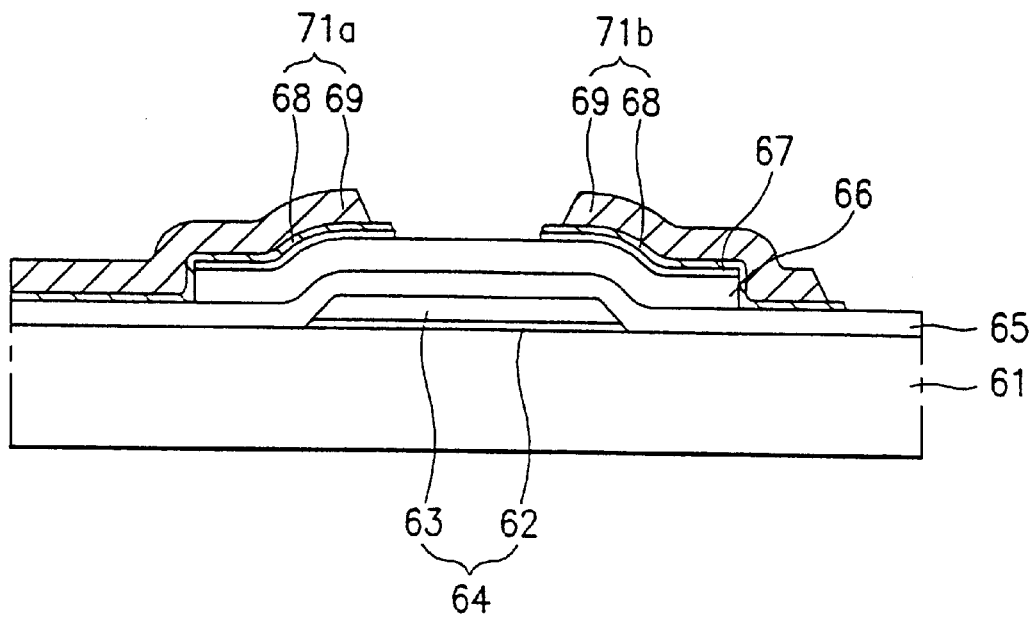
Figure 6H:
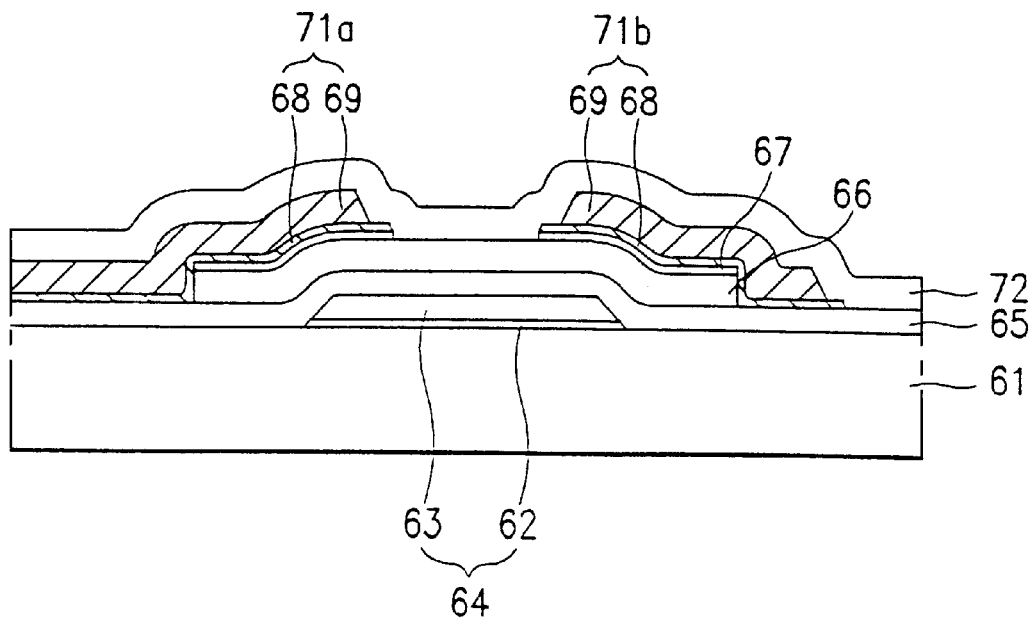

As shown in FIG. 6G, the exposed n+ amorphous silicon layer 67 is etched to expose the amorphous silicon layer 66. Then, the photoresist 70 is removed. Subsequently, passivation layer 72 is formed all over substrate 61 including the source and drain electrodes 71a and 71b to complete the preferred embodiment of a method for manufacturing a thin film transistor according to the present invention.

As described above, the preferred embodiments of a thin film transistor and a manufacturing method for the same have various advantages. The preferred embodiments employ a single etching process in patterning the two-layered source and drain electrodes to simplify the production process, reduce the process steps (e.g., separate etching steps) and reduce manufacturing costs. Further, the preferred embodiments improve step coverage at the edge of the drain electrode toward the storage capacitor to increase the reliability of semiconductor devices.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations win be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A thin film transistor, comprising:

a substrate;

a gate on the substrate;

a gate insulating layer on the substrate and the gate electrode;

a first semiconductor layer on the gate insulating layer;

a second semiconductor layer on the first semiconductor layer, wherein the second semiconductor layer exposes a prescribed portion of the first semiconductor layer; and first and second electrodes on the second semiconductor layer to expose the first and second semiconductor layers over the gate, wherein edges of the first and second electrodes adjacent to the exposed surface of the second semiconductor layer are non-linearly inclined.

2. The thin film transistor according to claim 1, wherein the first and second electrodes include a first conductive material and a second conductive material stacked on the first conductive material.

3. The thin film transistor according to claim 2, wherein the first and second conductive layers are etched concurrently in a single process using a single etchant to form source and drain electrodes.

4. The thin film transistor according to claim 2, wherein the first conductive material does not correspond to the second conductive material at the edges of the first and second electrodes, and wherein the first conductive material is chromium and the second conductive material is molybdenum.

5. The thin film transistor according to claim 2, wherein the second conductive material is thicker than the first conductive material, and wherein an etching ratio of the second conductive material to the first conductive material is approximately 10 to 1.

6. The thin film transistor according to claim 1, wherein the first semiconductor layer is an amorphous silicon layer, the second semiconductor layer is an n+ amorphous silicon layer and wherein the gate comprises:

a gate electrode patterned on the substrate; and a gate insulating layer on the substrate and the gate electrode, wherein the gate electrode has a trapezoidal shape.

7. A thin film transistor, comprising:

a substrate;

a gate electrode on the substrate;

a gate insulating layer on the substrate and the gate electrode;

a first semiconductor layer on the gate insulating layer;

a second semiconductor layer on the first semiconductor layer on the gate electrode;

a first conductive material on the second semiconductor layer; and a second conductive material on the first conductive material, wherein the first and second conductive materials expose the second semiconductor layer over the gate electrode, and wherein the first and second conductive materials have a tier structure to expose edges of the first conductive material.

8. The thin film transistor according to claim 7, wherein the first conductive material and the second conductive material are stacked to be source and drain electrodes.

9. The thin film transistor according to claim 7, wherein the first conductive material and the second conductive material are selectively removed at the same time using a single etchant.

10. The thin film transistor according to claim 7, wherein the edges of first conductive material do not correspond to the second conductive material.

11. The film transistor according to claim 6, wherein etching the second conductive material is higher than etching the first conductive material in speed, and etching the first conductive material is higher than etching the second conductive material in speed.

* * * * *